(12) United States Patent
Godet et al.

(10) Patent No.: US 11,851,740 B2
(45) Date of Patent: Dec. 26, 2023

(54) PVD DIRECTIONAL DEPOSITION FOR ENCAPSULATION

(71) Applicant: Applied Materials, Inc., Santa Clara, CA (US)

(72) Inventors: Ludovic Godet, Sunnyvale, CA (US); Bencherki Mebarki, Santa Clara, CA (US); Jinxin Fu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 733 days.

(21) Appl. No.: 16/716,691

(22) Filed: Dec. 17, 2019

(65) Prior Publication Data

US 2020/0192108 A1 Jun. 18, 2020

Related U.S. Application Data

(60) Provisional application No. 62/780,793, filed on Dec. 17, 2018.

(51) Int. Cl.
*C23C 14/04* (2006.01)
*G02B 27/10* (2006.01)
(Continued)

(52) U.S. Cl.
CPC .......... *C23C 14/046* (2013.01); *C23C 14/042* (2013.01); *C23C 14/225* (2013.01);
(Continued)

(58) Field of Classification Search
CPC ... C23C 14/042; C23C 14/046; C23C 14/225; C23C 14/3407; C23C 14/3464;
(Continued)

(56) References Cited

U.S. PATENT DOCUMENTS

| 5,985,102 A | 11/1999 | Leiphart |
| 2002/0046945 A1* | 4/2002 | Hosokawa ............... C23C 14/56 204/298.18 |

(Continued)

FOREIGN PATENT DOCUMENTS

| CN | 1781036 A | 5/2006 |
| CN | 101889102 A | 11/2010 |

(Continued)

OTHER PUBLICATIONS

International Search Report and Written Opinion for Application No. PCT/US2019066710 dated Apr. 16, 2020.

(Continued)

*Primary Examiner* — Rodney G McDonald
(74) *Attorney, Agent, or Firm* — Patterson + Sheridan, LLP (57) ABSTRACT

Embodiments described herein relate to encapsulated nanostructured optical devices and methods of encapsulating gratings of such devices by asymmetric selective physical vapor deposition (PVD). In some embodiments, a method for encapsulating optical device gratings includes a first PVD process and a second PVD process that may be carried out simultaneously or sequentially. The first PVD process may provide a first stream of material at a first angle non-perpendicular to a substrate of the grating. The second PVD process may provide a second stream of material at a second angle non-perpendicular to the substrate of the grating. The combination of the first PVD process and the second PVD process forms an encapsulation layer over the grating and one or more air gaps between adjacent fins of the grating.

20 Claims, 6 Drawing Sheets (51) Int. Cl.
*G02B 27/01* (2006.01)
*G02B 6/132* (2006.01)
*C23C 14/22* (2006.01)
*C23C 14/34* (2006.01)

(52) U.S. Cl.
CPC ...... *C23C 14/3407* (2013.01); *C23C 14/3464* (2013.01); *G02B 6/132* (2013.01); *G02B 27/0172* (2013.01); *G02B 27/1073* (2013.01); *G02B 2027/0178* (2013.01)

(58) Field of Classification Search
CPC .... C23C 14/568; G02B 1/14; G02B 27/0172; G02B 27/1073; G02B 5/1861; G02B 6/12004; G02B 6/1226; G02B 6/124; G02B 6/13; G02B 6/132
USPC ............. 204/298.11, 298.26, 192.12, 192.26
See application file for complete search history.

(56) References Cited

U.S. PATENT DOCUMENTS

| | | | |
|---|---|---|---|
| 2003/0068215 A1 | 4/2003 | Mori et al. | |
| 2003/0180024 A1 | 9/2003 | Edlinger et al. | |
| 2003/0224116 A1 | 12/2003 | Chen et al. | |
| 2004/0171235 A1 | 9/2004 | Snowdon et al. | |
| 2005/0128592 A1* | 6/2005 | Nishii | B82Y 20/00 |
| | | | 359/563 |
| 2006/0054494 A1 | 3/2006 | Reiss | |
| 2007/0095651 A1 | 5/2007 | Ye et al. | |
| 2008/0121610 A1 | 5/2008 | Nagata et al. | |
| 2009/0148599 A1 | 6/2009 | Ramm et al. | |
| 2012/0075699 A1* | 3/2012 | Davis | G02B 5/3058 |
| | | | 359/492.01 |
| 2019/0276926 A1 | 9/2019 | Lee et al. | |

FOREIGN PATENT DOCUMENTS

| | | |
|---|---|---|
| CN | 102197457 A | 9/2011 |
| CN | 102453874 A | 5/2012 |
| CN | 103443324 A | 12/2013 |
| CN | 106256926 A | 12/2016 |
| CN | 106663632 A | 5/2017 |
| EP | 0 230 652 | * 12/1986 |
| JP | H08269710 A | 10/1996 |
| JP | 2006003447 A | 1/2006 |
| KR | 10-20150003137 A | 1/2015 |
| KR | 10-20170020681 A | 2/2017 |
| WO | 2009039261 A1 | 3/2009 |

OTHER PUBLICATIONS

EPO Extended European Search Report dated Jul. 19, 2022, for European Application No. 19900271.8.
Chinese Office Action dated Dec. 22, 2022 for Application No. 201980083748.3.
Taiwan Office Action issued to Application No. 108146141 dated Apr. 18, 2023.
Chinese Office Action dated Jul. 6, 2023, for Chinese Patent Application No. 201980083748.3.

* cited by examiner

PVD DIRECTIONAL DEPOSITION FOR ENCAPSULATION

CROSS-REFERENCE TO RELATED APPLICATIONS

This application claims benefit of U.S. Provisional Patent Application Ser. No. 62/780,793, filed Dec. 17, 2018, which is herein incorporated by reference in its entirety.

BACKGROUND

Field

Embodiments of the present disclosure generally relate to optical devices. More specifically, embodiments of the present disclosure relate to a method of encapsulating gratings of nanostructured optical devices.

Description of the Related Art

Virtual reality is generally considered to be a computer-generated simulated environment in which a user has an apparent physical presence. A virtual reality experience can be generated in 3D and viewed with a head-mounted display (HMD), such as glasses or other wearable display devices that have near-eye display panels as lenses to display a virtual reality environment that replaces an actual environment.

Augmented reality, however, enables an experience in which a user can still see through the display lenses of the glasses or other HMD device to view the surrounding environment, yet also see images of virtual objects that are generated for display and appear as part of the environment. Augmented reality can include any type of input, such as audio and haptic inputs, as well as visual images, graphics, and video that enhances or augments the real environment that the user experiences. As an emerging technology, there are many challenges and design constraints with augmented reality.

One such challenge is displaying a virtual image overlaid on an ambient environment. Waveguides are used to assist in overlaying images. Generated light is propagated through a waveguide until the light exits the waveguide and is overlaid on the ambient environment. Fabricating waveguides can be challenging as waveguides tend to have non-uniform properties. Accordingly, what is needed in the art is an improved method of encapsulating gratings of waveguides.

SUMMARY

In one embodiment, a method of encapsulating gratings of optical devices by asymmetric selective physical vapor deposition (PVD) is shown and described herein. The method includes providing a first stream of a first material from a first PVD source in a first direction towards one or more surfaces of a first fin structure on a substrate at a first non-perpendicular angle relative to a substrate surface, depositing the first material on the one or more surfaces of the first fin structure to form a first protrusion extending laterally from the first fin structure, providing a second stream of a second material from a second PVD source in a second direction towards one or more surfaces of a second fin structure on the substrate at a second non-perpendicular angle relative to the substrate surface, and depositing the second material on the one or more surfaces of the second fin structure to form a second protrusion extending laterally from the second fin structure. The second protrusion converges with the first protrusion to form an encapsulation layer over the first and second fin structures.

In one embodiment, a method of encapsulating gratings of optical devices by asymmetric selective physical vapor deposition (PVD) is shown and described herein. The method includes providing a first stream of a first material from a first PVD source in a first direction towards one or more surfaces of a grating disposed on a substrate at a first non-perpendicular angle relative to a plane of an upper surface of the substrate, depositing the first material on the one or more surfaces of the grating, providing a second stream of a second material from a second PVD source in a second direction towards the one or more surfaces of the grating at a second non-perpendicular angle relative to the plane of the upper surface of the substrate, and depositing the second material on the one or more surfaces of the grating. The deposition of the first material and the second material on the one or more surfaces of the grating forms an encapsulation layer over the grating, the encapsulation layer partially defining one or more air gaps between adjacent fins of the grating.

In one embodiment, a method of encapsulating gratings of optical devices by asymmetric selective physical vapor deposition (PVD) is shown and described herein. The method includes providing a first stream of a first material from a first PVD source in a first direction towards one or more surfaces of a first fin structure on a substrate and at a first non-perpendicular angle relative to the substrate surface, directing the first stream of the first material through a collimator having at least one opening to limit an angular range of the first material passing through the at least one opening, depositing the first material on the one or more surfaces of the first fin structure to form a first protrusion extending laterally from a top portion of the first fin structure, providing a second stream of a second material from a second PVD source in a second direction towards one or more surfaces of a second fin structure on the substrate and at a second non-perpendicular angle relative to the substrate surface; directing the second stream of the second material through the collimator having the at least one opening

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to angled PVD apparatus and methods. More specifically, embodiments described herein provide a method of depositing an encapsulation layer on a grating.

Embodiments described herein relate to encapsulated nanostructured optical devices and methods of encapsulating gratings of such devices by asymmetric selective physical vapor deposition (PVD). Examples of nanostructured optical devices include waveguides and metalenses. In some embodiments, a method for encapsulating optical device gratings includes a first PVD process and a second PVD process that may be carried out simultaneously or sequentially. The first PVD process may provide a first stream of material at a first angle non-perpendicular to a substrate of the grating. The second PVD process may provide a second stream of material at a second angle non-perpendicular to the substrate of the grating. The combination of the first PVD process and the second PVD process forms an encapsulation layer over the grating and one or more air gaps between adjacent fins of the grating.

Figure 1:
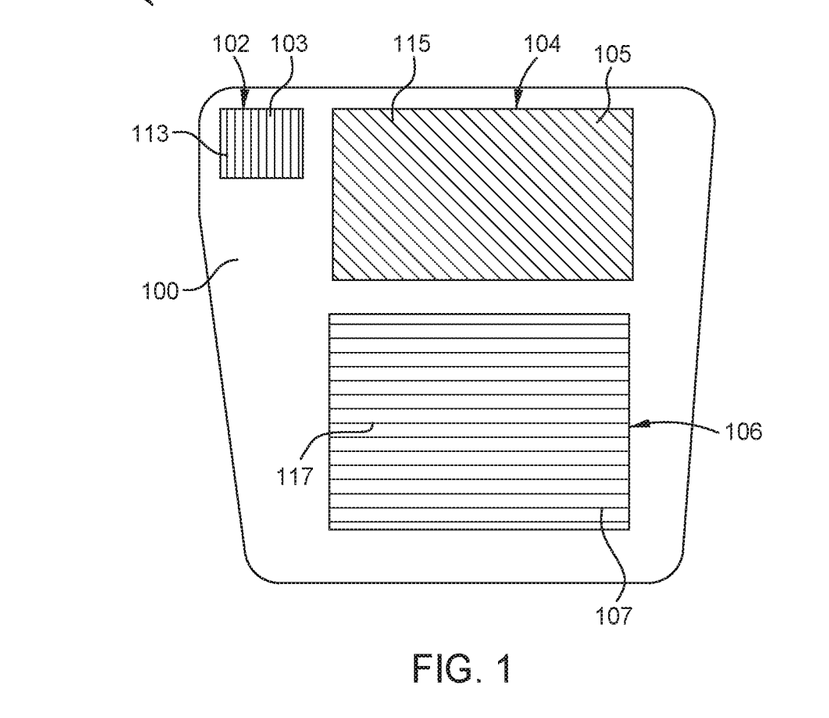
FIG. 1 is a schematic, frontal view of a waveguide combiner according to an embodiment described herein.

FIG. 1 illustrates a perspective, frontal view of an exemplary waveguide combiner 100 (e.g. for VR or AR applications) having three gratings 103, 105, and 107. It is to be understood that the waveguide combiner 100 described below is an exemplary waveguide combiner that may be formed utilizing the systems and methods described herein, and that the systems and methods of the present disclosure may be utilized to form or modify other optical devices and nanostructured optical devices, such as other waveguide combiners. For example, an optical device having more than three gratings may be formed, such as five or more gratings. Alternatively, an optical device having less than three gratings may be formed, such as two pluralities of gratings. In another example, an optical device having gratings on both major planar sides may be formed. In yet another example, an optical device having more than one input coupling region and more than one output coupling region may be formed.

The waveguide combiner 100 includes an input coupling region 102 defined by the first grating 103, an intermediate region 104 defined by the second grating 105, and an output coupling region 106 defined by the third grating 107. Each grating 103, 105, and 107 includes a plurality of fins 113, 115, 117, respectively. In some embodiments, one or more of the pluralities of fins 113, 115, and 117 include fins having different geometries, such as different slant angles or dimensions from that of other fins in that grating. Additionally, a slant angle of one discreet fin within the plurality of fins 113, 115, or 117 may be different across a length or width of the grating thereof. In some embodiments, the input coupling region 102, intermediate region 104, and output coupling region 106 are arranged so as to achieve substantially total internal reflection of light between the input coupling region 102 and the output coupling region 106.

Figure 2:
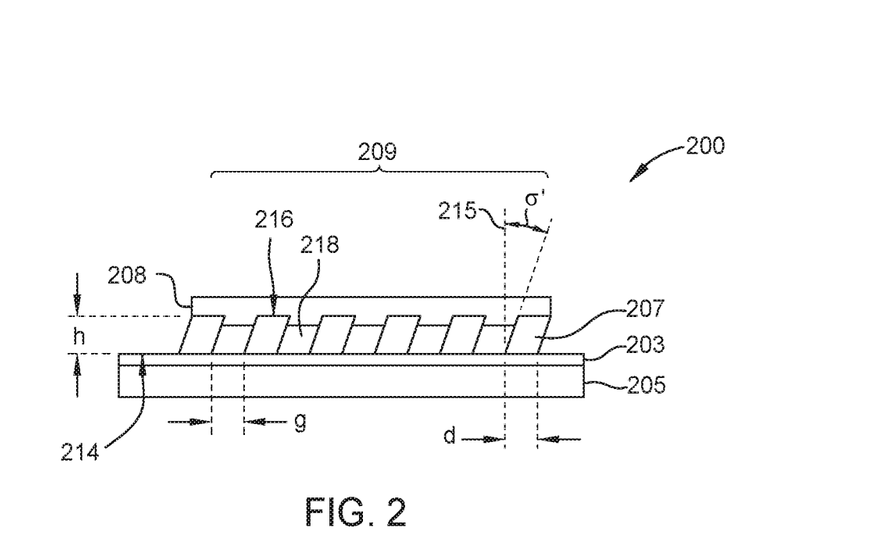
FIG. 2 is a schematic, cross-sectional view of a region of a waveguide combiner having encapsulated gratings according to an embodiment described herein.

FIG. 2 illustrates a schematic, cross-sectional view of an exemplary grating 200 according to embodiments described herein. The grating 200 may be substantially similar to one of the gratings 103, 105, or 107 and thus, may be utilized in one of the input coupling region 102, the intermediate region 104, or the output coupling region 106.

The grating 200 includes a grating material layer 203 disposed on a substrate 205. In some embodiments, the grating material layer 203 may be disposed on one or more spacer layers (not shown) disposed on the substrate 205. In embodiments including a spacer layer, the spacer layer is operable to provide support for the grating 200 and is of a thickness and material according to the desired optical characteristics of the grating 200.

The substrate 205 may be formed from any suitable material and have any suitable thickness, provided that the substrate 205 can adequately transmit light in a desired wavelength or wavelength range and can serve as an adequate support for the grating 200. In some embodiments, the material of the substrate 205 includes, but is not limited to, one or more of silicon (Si), silicon dioxide ($SiO_2$), glass, plastic, polycarbonate, and sapphire-containing materials. In some embodiments, the substrate 205 includes doped glass. For example, the substrate 205 includes glass doped with a heavy dopant such as lanthanum (La), zirconium (Zr), zinc (Zn), and the like. The materials of the substrate 205 may further have rollable and flexible properties. In some embodiments, the material of the substrate 205 includes, but is not limited to, materials having a refractive index between about 1.5 and about 2.4. For example, the substrate 205 may be a doped high index substrate having a refractive index between about 1.7 and about 2.4.

The grating material layer 203 includes at least one of silicon oxycarbide (SiOC), titanium oxide ($TiO_x$), $TiO_x$ nanomaterials, niobium oxide ($NbO_x$), niobium-germanium ($Nb_3Ge$), silicon dioxide ($SiO_2$), silicon oxycarbonitride (SiOCN), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), $Si_3N_4$ silicon-rich, $Si_3N_4$ hydrogen-doped, $Si_3N_4$ boron-doped, silicon carbon nitrate (SiCN), titanium nitride (TiN), zirconium dioxide ($ZrO_2$), germanium (Ge), gallium phosphide (GaP), poly-crystalline (PCD), nanocrystalline diamond (NCD), and doped diamond containing materials. The grating material layer 203 may be formed over the surface of the substrate 205 by any suitable means. For example, the grating material layer 203 may be formed by one or more of PVD, chemical vapor deposition (CVD), plasma-enhanced CVD (PECVD), flowable CVD (FCVD), atomic layer deposition (ALD), and spin-on processes. In some embodiments, the material of the grating material layer 203 has a refractive index between about 1.5 and about 2.65. In some embodiments, the material of the grating material layer 203 has a refractive index between about 3.5 and 4.0.

The grating material layer 203, in accordance with the methods described herein, includes a plurality of fins 207 disposed thereon having a height h and a lateral distance d. In the embodiment illustrated in FIG. 2, the height h of the fins 207 is defined as the distance from a surface 214 of the grating material layer 203 to a top surface 216 of the fins 207. In embodiments without a grating material layer 203, the height h of the fins 207 may be defined as the distance from a top surface of the substrate 205 to the top surface 216 of the fins 207. A gap g is the distance between adjacent fins 207 of the grating 200. In some embodiments, the gap g of each of the adjacent fins 207 of the plurality of fins 207 is substantially the same. In another embodiment, the gap g of at least one set of adjacent fins 207 is different than the gap g of additional sets of adjacent fins 207 of the plurality of fins 207. In some embodiments (as shown in FIG. 2), the plurality of fins 207 may have a single portion 209 of fins 207, each fin 207 therein having the same slant angle $\vartheta'$ relative to the surface normal 215. In some embodiments (not shown), the plurality of fins 207 may have two or more portions of fins 207, each of which may have a different slant angle $\vartheta'$ relative to the surface normal 215 of the substrate 205. In some embodiments, the material of the grating material layer 203 is selected based on the desired depth and slant angle of the plurality of fins 207. In some embodiments, the fins 207 may have a slant angle $\vartheta'$ equal to zero relative the surface normal 215, and thus, the fins 207 may be binary fins.

The grating 200 further includes an encapsulation layer 208 disposed over the plurality of fins 207. The encapsulation layer 208 is a substantially planar layer of material disposed over the top surfaces 216 of the fins 207 that, together with the fins 207 and the surface 214 of the substrate 205 or top surface of the spacer layer, defines one or more air gaps (e.g., cavities) 218 disposed between adjacent fins 207. In some embodiments, the encapsulation layer 208 has a thickness between about 5 nm and about 1000 nm, such as between about 50 nm and about 750 nm. For example, the encapsulation layer 208 has a thickness between about 100 nm and about 600 nm, such as between about 200 nm and about 400 nm, such as about 300 nm.

Typically, the encapsulation layer 208 has a refractive index that is lower than that of the grating material layer 203. In some embodiments, the refractive index of the encapsulation layer 208 is between about 1.0 and about 1.7, such as between about 1.2 and about 1.5. In some embodiments, the encapsulation layer 208 has an absorption coefficient less than about 0.001. The encapsulation layer 208 may be formed of any suitable transparent materials, including but not limited to silica-containing materials and non-silica-containing materials, such as polymer-containing materials, for example, fluoropolymer materials. In some embodiments, the encapsulation layer 208 is formed of silicon dioxide ($SiO_2$) or a low-k dielectric films such as carbon- and nitride-doped silicon oxide (SiCON) or silicon carbon nitride (SiCN). In some embodiments, the encapsulation layer 208 includes fluorine-containing materials, such as aluminum fluoride ($AlF_3$) and magnesium fluoride ($MgF_2$). In other embodiments, the encapsulation layer 208 and the substrate 205 or the grating material layer 203 are formed of substantially the same materials.

Each air gap 218 has a height substantially similar to the height h of the fins 207 adjacent thereto and a width equal to the gap g between the adjacent fins 207. The air gaps 218 may be filled with atmospheric air or any other suitable gas. Air has a refractive index of 1.0 and an absorption coefficient of 0 and thus, having the air gaps 218 filled with air may enable improved optical transmission through the gratings 200 as compared to using a gap-fill material or other coating. Accordingly, the air gaps 218 may enable better efficiency of the grating 200 and reduce the height h of the fins 207 needed in the optical device design. In some embodiments, the air gaps 218 are filled with one or more gases at or near atmospheric pressure. In other embodiments, the air gaps 218 are filled with one or more gases at sub-atmospheric pressure.

Figure 3:
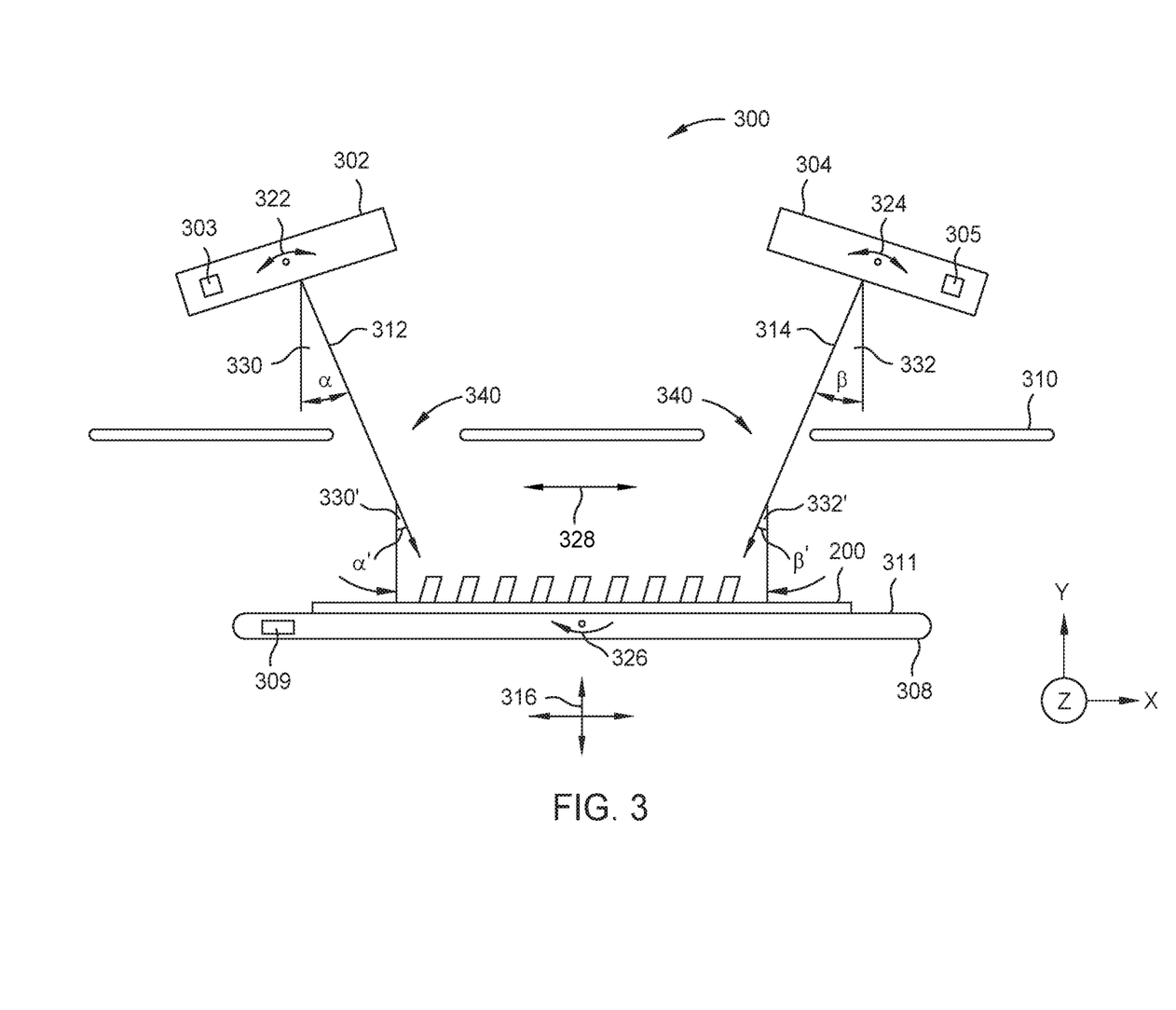
FIG. 3 is a schematic diagram of an apparatus used for PVD deposition according to an embodiment described herein.

FIG. 3 is a schematic side view of an apparatus 300 for PVD deposition in accordance with at least some embodiments of the present disclosure. Specifically, FIG. 3 schematically depicts an apparatus 300 for angled PVD onto a grating to form a generally planar encapsulation layer thereon. The apparatus 300 generally includes a first PVD source 302, a support 308 for supporting the grating 200, and an optional collimator 310. The first PVD source 302 is configured to provide a first directed stream of material (stream 312 as depicted in FIG. 3) from the PVD source 302 toward the support 308 (and the grating 200 or other substrate disposed on the support 308). In some embodiments, the apparatus 300 includes a second directed stream of material flux (stream 314 as depicted in FIG. 3) from a PVD source 304 toward the support 308 (and the grating 200 or other substrate disposed on the support 308). The first and/or second PVD sources 302, 304 may be coupled to rotatable lid (not shown) or other rotatable support structure to enable up to 360 degrees or 180 degrees rotation of the first and/or second PVD sources 302, 304 about a y-axis with respect to the support 308.

The support 308 includes a support surface 311 to support the grating 200 such that one or more working surfaces of the grating 200 to be deposited on is exposed to the first stream 312 and the second stream 314. The support 308 may be configured to move (e.g., scanned) along an x-, y-, and z-axes with respect to the first and second PVD sources 302, 304, as indicated by arrows 316, where the movement can be linear or non-linear. Optionally, the support 308 may additionally be configured to rotate about the y-axis or tilt about x- and z-axes, as indicated by the arrows 316. Generally, the support 308 is coupled to an actuator 309 for translational and rotational actuation of the support 308 about the x-, y-, and z-axes.

The first and second PVD sources 302, 304 include target material to be sputter deposited on the grating 200. In some embodiments, the target material of the first and second PVD sources 302, 304 are the same target material. In other embodiments, the target material provided by the first and second PVD sources 302, 304 are different from each other. In some embodiments, the target material includes one or more materials to be included in the encapsulation layer 208 described above. For example, the target material may include silica-containing materials and non-silica-containing materials, such as polymer-containing materials, for example, fluoropolymer materials. In some embodiments, the target material includes a silicon-containing (Si) material, such as silicon dioxide ($SiO_2$), carbon- and nitride-doped silicon oxide (SiCON), and/or silicon carbon nitride (SiCN). In some embodiments, the target material includes aluminum-containing (Al) materials. In some embodiments, the target material includes fluorine-containing ($F_2$) materials, such as aluminum fluoride ($AlF_3$) and magnesium fluoride ($MgF_2$). Other materials may suitably be used as well in accordance with the teaching provided herein. The PVD sources 302, 304 further include, or are coupled to, a power source to provide suitable power for forming a plasma proximate the target material and for sputtering atoms off of the target material. The power source can be either or both of a DC or an RF power source.

In some embodiments, unlike an ion beam or other ion source, the first and second PVD sources 302, 304 are configured to provide mostly neutrals and few ions of the target material. As such, a plasma may be formed having sufficiently low density to avoid ionizing too many of the sputtered atoms of target material. The power or power density applied can be scaled for other size waveguides or other substrates. In addition, other parameters may be controlled to assist in providing mostly neutrals in the streams 312, 314 of material. For example, the pressure may be controlled to be sufficiently low so that the mean free path is longer than the general dimensions of an opening of the first and second PVD sources 302, 304 through which the stream of material flux passes toward the support 308. In some embodiments, the pressure may be controlled to be between about 0.5 millitorr (mTorr) and about 25 mTorr, such as between about 1 mTorr and about 20 mTorr, such as between about 5 mTorr and about 15 mTorr, such as about 10 mTorr.

In embodiments consistent with the present disclosure, the lateral angles of incidence of the first and second streams 312, 314 of material flux can be controlled. For example, FIG. 3 depicts the apparatus 300 illustrating material deposition angle α 330 of the first stream 312 from the first PVD source 302 and angle β 332 of the second stream 314 from the second PVD source 304 in accordance with at least some embodiments of the present disclosure. In some embodiments, the angles α 330 and β 332 can either be fixed or adjustable by tilting the first PVD source 302 as shown by arrow 332 and/or tilting the second PVD source 304 as shown by arrow 324. Accordingly, the first and second PVD sources 302, 304 are communicatively coupled to actuators 303, 305 for tilting the PVD sources 302, 304 about the x- and z-axes.

As described above, the apparatus 300 may include an optional collimator 310. In some embodiments, the collimator 310 is a physical structure such as a shroud, a disk, or a plurality of baffles having one or more openings 340 that is interposed between the PVD sources 302, 304 and the grating 200 such that the streams 312, 314 of material flux travel through the structure (e.g., collimator 310). Any materials with an angle too large or too small to pass through the openings 340 of the collimator 310 will be blocked, thus limiting a permitted angular range of material reaching the grating 200. In some embodiments, the collimator 310 may include a single opening. In other embodiments, the apparatus 300 includes a single collimator 310 having multiple openings. Still, in other embodiments, the collimator 310 may include multiple collimators, each having one or more openings. As used herein, the collimator 310 functions as a spread angle control apparatus that controls the angle of the spread of materials being sputtered from the first and/or second PVD sources 302, 304. In some embodiments, the one or more collimators 310 can move linearly as shown by the arrow 328.

In some embodiments, the angles of incidence 330', 332' at which the streams 312, 314 of material actually contact one or more surfaces of the grating 200 may be different than the angles of incidence 330, 332 at which the streams 312, 314 of material are provided by the first PVD source 302 and the second PVD source 304. The angles of incidence 330', 332' at which the streams 312, 314 of material actually contact the grating 200 surfaces can be controlled (e.g., altered) by one or more of the following: the angles of incidence 330, 332 at which the streams of material are provided by the first and second PVD sources 302, 304, the number and placement of openings in the optional collimator 310, the linear position of the optional collimator 310 relative to the PVD sources 302, 304 and the grating 200 or support 308, and the rotation 326 and linear movement 316 of the support 308.

Figure 4:
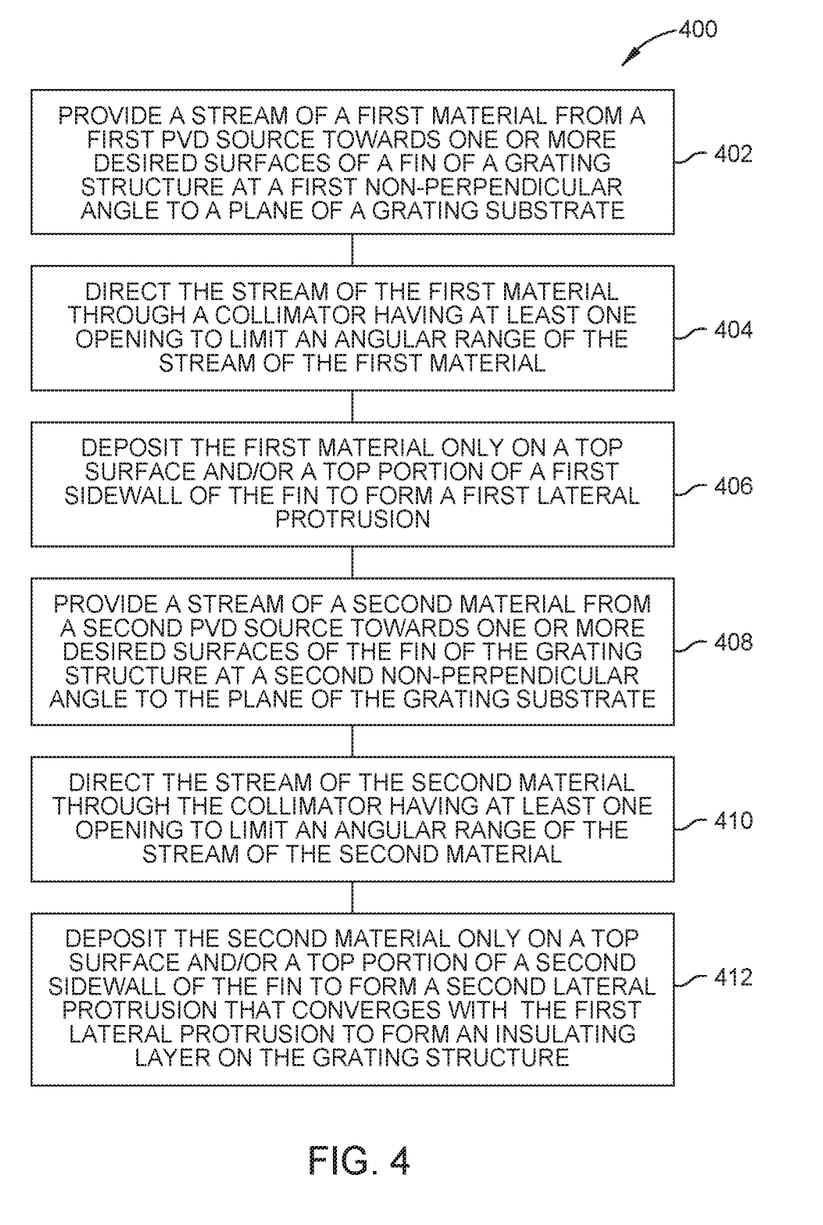
FIG. 4 is a flow diagram of a method of forming an encapsulation layer over a grating of a waveguide according to an embodiment described herein.
Figure 5A:
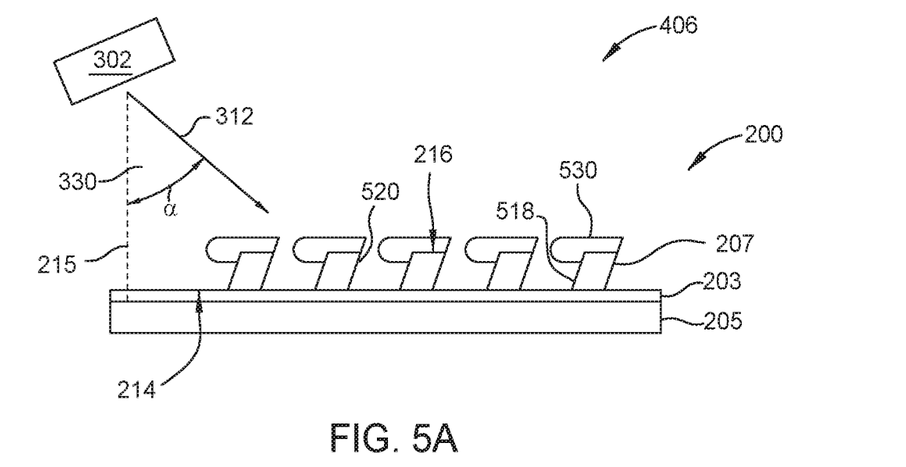
FIGS. 5A and 5B are schematic illustrations of a method of forming an encapsulation layer over a grating of a waveguide according to an embodiment described herein.
Figure 5B:
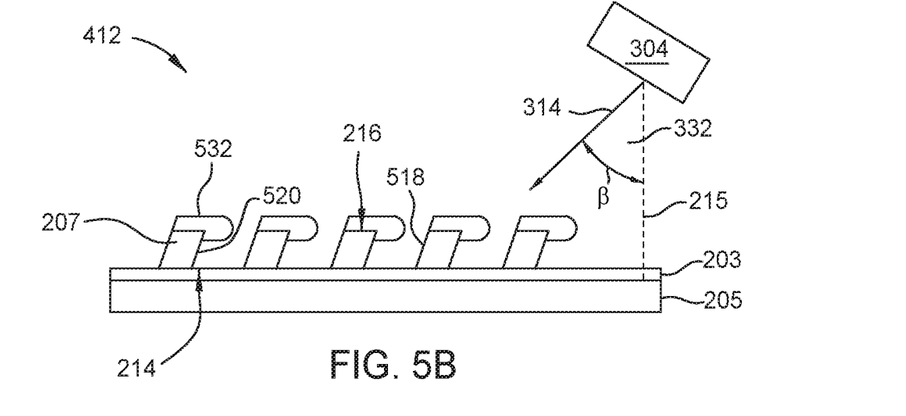

The methods and embodiments disclosed herein advantageously enable deposition of materials to encapsulate gratings of waveguides. For example, FIG. 4 is a flow diagram of a method 400 of forming the encapsulation 208 layer over a plurality of fins 207 of the grating 200 using the apparatus 300, according to an embodiment. FIGS. 5A and 5B are schematic illustrations of the method 400 of forming the encapsulation layer 208, according to an embodiment. Specifically, FIGS. 5A and 5B depict schematic cross-sectional views of the grating 200 having the encapsulation layer 208 deposited thereon. Although the grating 200 is depicted, other structures including optical devices having features such as pillars, trenches, vias, or the like may equally benefit from the methods described herein.

The method 400 for depositing the encapsulation layer 208 on the grating 200 begins at operation 402, where a first stream 312 of material is provided from the first PVD source 302 towards one or more surfaces of the fins 207 in a first direction. For example, the first PVD source 302 may be biased and bombarded with inert gas ions, such as argon (Ar), krypton (Kr), and xenon (Xe) ions, to sputter deposit the first stream 312 of material onto the plurality of fins 207. In some embodiments, the PVD chemistry is a reactive PVD chemistry. For example, the PVD chemistry may include oxygen ($O_2$), nitrogen ($N_2$), hydrogen ($H_2$), a mixture of argon and oxygen, and/or a mixture of argon and fluorine ($F_2$) gases. The first stream 312 of material is provided at the first angle α 330 which is non-perpendicular relative to a plane of the top surface 214 of the substrate 205. The first angle α 330 is selected based upon the desired dimensions of the encapsulation layer 208 and the fins 207, as well as the slant angle(s) of the fins 207. In some embodiments, the first angle α 330 is between about 45 degrees and about 89 degrees relative to the surface normal 215 of the substrate 205, such as between about 60 degrees and about 89 relative to the surface normal 215 of the substrate 205. For example, the first angle α 330 is between about 75 degrees and about 85 degrees, such as between about 78 degrees and about 82 degrees, relative to the surface normal 215 of the substrate 205.

At operation 404, the first stream 312 of material is optionally directed through the collimator 310 having at least one opening 340 to further limit the angular range (e.g., spread) of the first stream 312 passing therethrough, thus further limiting the angle of deposition of the first stream 312 of material onto the fins 207. In some embodiments, it is the combination of the angle of the stream provided by the first PVD source 302, the physical structure and placement of the optional collimator 310, a surface angle of the support 308 that controls the angle of incidence 330' that the first stream 312 of material contacts the fins 207. By controlling the angle of incidence 330', as well as linearly moving the grating 200 relative to the first PVD source 302 and/or the collimator 310 during deposition, selective and asymmetric deposition of the target material onto the fins 207 may be accomplished. Specifically, at operation 406 (depicted in FIG. 5A), the first stream 312 material is deposited only on desired surfaces of the fins 207, such as the top surface 216 and/or a top portion of a first sidewall 518 of at least one fin 207. As shown in FIG. 5A, there is no deposition of the first stream 312 of material on a second sidewall 520 and little or no deposition of the first stream 312 of material near the top surface 214 of the substrate 205. Accordingly, one or more first lateral protrusions 530 are formed by the deposition of the first stream 312 of material that extends laterally from the top portion of the first sidewall 518 and/or the top surface 216 of the fins 207. The first lateral protrusions 530 eventually form a portion of the encapsulation layer 208 upon completion of the method 400.

At operation 408, which may occur simultaneously with or sequentially after any of the operations 402 through 406 above, a second stream 314 of material is provided from the second PVD source 304 towards one or more surfaces of the fins 207 in a second direction. For example, the second PVD source 304 may be biased and bombarded with inert gas ions to sputter deposit the second stream 314 of material onto the plurality of fins 207. The second stream 314 of material is provided at the second angle β 332 that is non-perpendicular relative to a plane of the top surface 214 of the substrate 205. The second angle β 332 is selected based upon the desired dimensions of the encapsulation layer 208 and the fins 207, as well as the slant angle(s) of the fins 207. In some embodiments, the second angle β 332 is between about 45 degrees and about 89 degrees relative to the surface normal 215 of the substrate 205, such as between about 60 degrees and about 89 degrees relative to the surface normal 215 of the substrate 205. For example, the first angle β 332 is between about 75 degrees and about 85 degrees, such as between about 78 degrees and about 82 degrees, relative to the surface normal 215 of the substrate 205.

At operation 410, the second stream 314 of material is optionally directed through the collimator 310 having at least one opening 340 to further limit the angular range (e.g., spread) of the second stream 314 passing therethrough, thus further limiting the angle of deposition of second stream 314 of material onto the fins 207. As described above, the combination of the angle of the stream provided by the second PVD source 304, the physical structure and placement of the optional collimator 310, and a surface angle of the support 308 may control the angle of incidence 332' that the second stream 314 of material contacts the fins 207.

At operation 412 (depicted in FIG. 5B), the second stream 314 of material is deposited only on desired surfaces of the fins 207, such as the top surface 216 and/or a top portion of the second sidewall 520 of at least one fin 207. As shown in FIG. 5B, there is no deposition of the second stream 314 of material on the first sidewall 518 and little or no deposition of the second stream 314 of material near the top surface 214 of the substrate 205. Accordingly, one or more second lateral protrusions 532 are formed by the deposition of the second stream 314 of material that extends laterally towards the first lateral protrusions 530 from the top portion of the second sidewall 520 and/or the top surface 216 of the fins 207. Upon further deposition as described above, first lateral protrusions 530 and the second lateral protrusions 532 eventually converge and integrate with one another to form the encapsulation layer 208 (depicted in FIG. 2).

Figure 6:
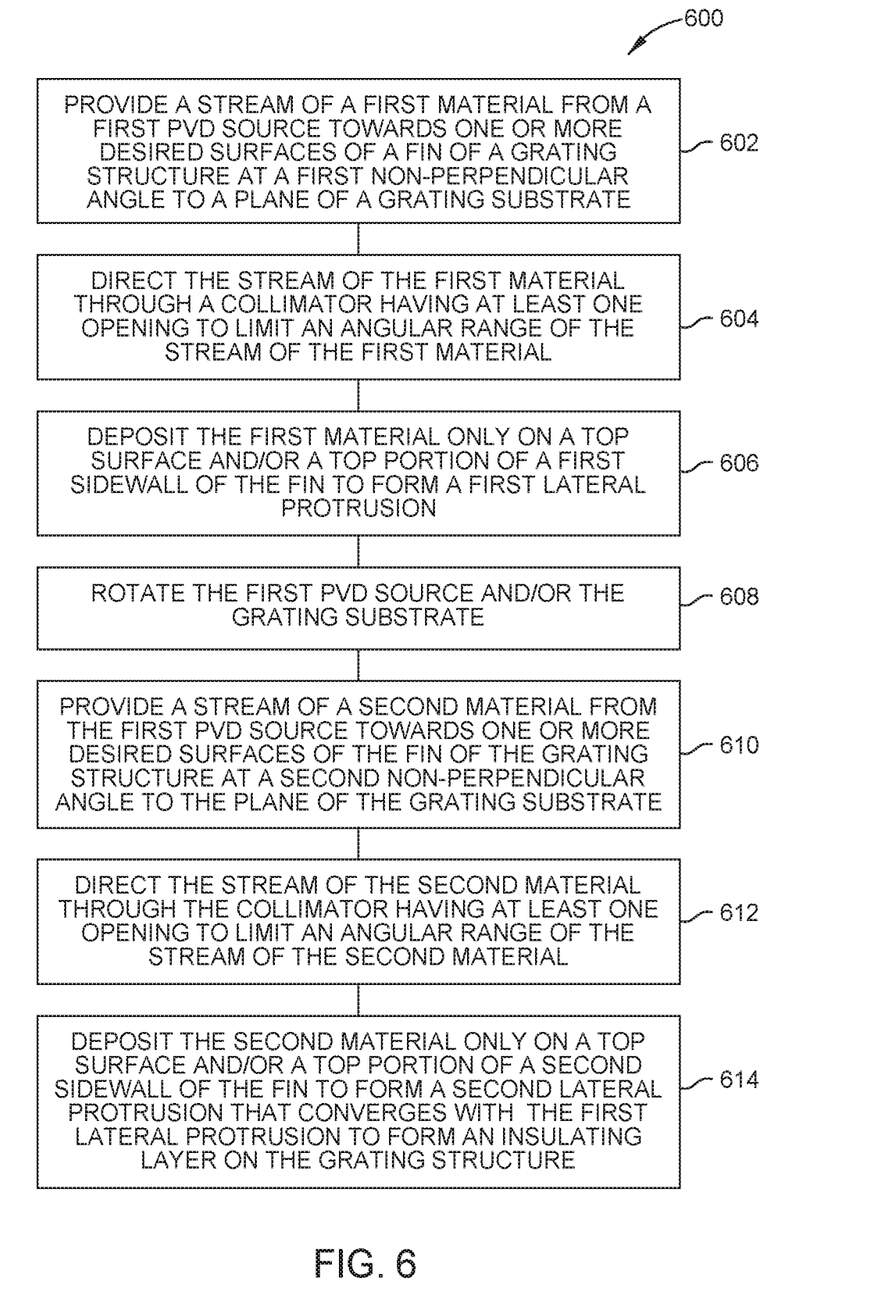
FIG. 6 is a flow diagram of a method of forming an encapsulation layer over a grating of a waveguide according to an embodiment described herein.
Figure 7A:
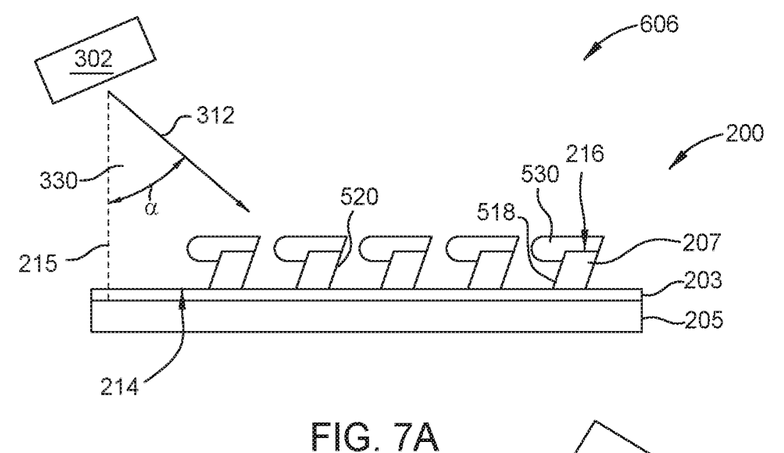
FIGS. 7A and 7B are schematic illustrations of a method of forming an encapsulation layer over a grating of a waveguide according to an embodiment described herein.
Figure 7B:
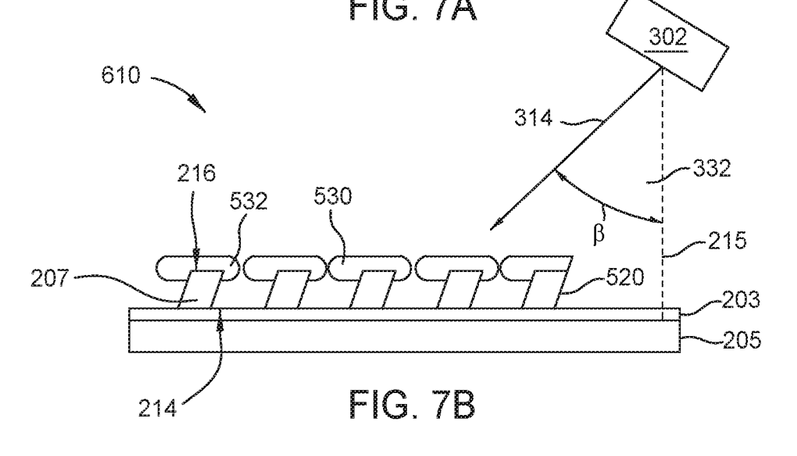

FIG. 6 is a flow diagram of an alternative method 600 of forming the encapsulation layer 208 over a plurality of fins 207 of the grating 200 using the apparatus 300, according to an embodiment. The method 600 is substantially similar to method 400 and includes several operations 602, 204, and 606 that are substantially similar to the operations 402, 404, and 406. Accordingly, only operations 608, 610, 612, and 614 of the method 600 will be herein described for clarity. FIGS. 7A and 7B are schematic illustrations of the method 600 of forming the encapsulation layer 208, according to an embodiment. Specifically, FIGS. 7A and 7B depict schematic cross-sectional views of the grating 200 having the encapsulation layer 208 deposited thereon. Although the grating 200 is depicted, other structures including optical devices having features such as pillars, trenches, vias, or the like may equally benefit from the methods described herein.

After deposition of the first stream 312 of material on desired surfaces of the fins 207 to form the first lateral protrusions 530 (shown in FIG. 7A), the grating 200 and/or the first PVD source 302 may be rotated about the y-axis at operation 608. For example, the support 308 and/or the first PVD source 302 may be rotated between about 1 degree and about 360 degrees, such as between about 1 degree and about 180 degrees, such as between about 1 degree and about 90 degrees, about the y-axis. Rotation of the support 308 and/or the first PVD source 302 causes the first PVD source 302 to have a different translational and angular orientation relative to the grating 200 than during formation of the first lateral protrusions 530, shown in FIG. 7B. Accordingly, rotation of the first PVD source 302 and/or the support 308 enables the provision of the second stream 314 of material from the first PVD source 302 in a second direction without the utilization of a second PVD source. Thus, the second lateral protrusions 532 may be formed to complete the formation of the encapsulation layer 208 with only the first PVD source 302.

At operation 610, the second stream 314 of material is provided from the first PVD source 302 towards one or more surfaces of the fins 207 in the second direction. For example, after rotation of the first PVD source 302 and/or the grating 200 on the support 308, the first PVD source 302 may again be biased and bombarded with inert gas ions to sputter deposit the second stream 314 of material onto the plurality of fins 207, this time in the second direction. Similar to operation 408, the second stream 314 of material is provided at the second angle β 332 that is based upon the desired dimensions of the encapsulation layer 208 and the fins 207, as well as the slant angle(s) of the fins 207. In some embodiments, the second angle β 332 is between about 45 degrees and about 89 degrees relative to the surface normal 215 of the substrate 205, such as between about 60 degrees and about 89 degrees relative to the surface normal 215 of the substrate 205. For example, the first angle β 332 is between about 75 degrees and about 85 degrees, such as between about 78 degrees and about 82 degrees, relative to the surface normal 215 of the substrate 205.

At operation 612, the second stream 314 of material is optionally directed through the collimator 310 having at least one opening 340 to further limit the angular range (e.g., spread) of the second stream 314 passing therethrough, thus further limiting the angle of deposition of second stream 314 of material onto the fins 207. As described above, the combination of the angle of the stream provided by the first PVD source 302, the physical structure and placement of the optional collimator 310, and a surface angle of the support 308 may control the angle of incidence 332' that the second stream 314 of material contacts the fins 207.

At operation 614 (depicted in FIG. 7B), the second stream 314 of material is deposited only on desired surfaces of the fins 207, such as the top surface 216 and/or a top portion of the second sidewall 520 of at least one fin 207. As shown in FIG. 7B, there is no deposition of the second stream 314 of material on the first sidewall 518 and little or no deposition of the second stream 314 of material near the top surface 214 of the substrate 205. Accordingly, one or more second lateral protrusions 532 are formed by the deposition of the second stream 314 of material that extends laterally towards the first lateral protrusions 530 from the top portion of the second sidewall 520 and/or the top surface 216 of the fins 207. Upon further deposition, first lateral protrusions 530 and the second lateral protrusions 532 eventually converge and integrate with one another to form the encapsulation layer 208 (depicted in FIG. 2).

Although depicted and described with reference to a single PVD source, the method 600 may be performed with both the first and second PVD sources 302, 304. Accordingly, two or more streams of material may be provided and deposited simultaneously or sequentially during any of the operations 602 through 614 above. Furthermore, in some embodiments, deposition may be performed simultaneously while the support 308 and/or the first and second PVD sources 302, 304 are rotated.

In summation, embodiments described herein provide waveguides with encapsulated gratings and methods of forming the same. The utilization of angled or direction PVD enables the formation of an encapsulation layer over a grating such that air gaps are formed between adjacent fins thereof. The utilization of air gaps between adjacent fins of a grating rather than a gap fill material may enable improved optical transmission through the grating, thus enhancing the optical performance of optical devices integrating such gratings.

While the foregoing is directed to examples of the present disclosure, other and further examples of the disclosure may be devised without departing from the basic scope thereof, and the scope thereof is determined by the claims that follow.

What is claimed is:

1. A method for encapsulating gratings of a waveguide combiner by asymmetric selective physical vapor deposition (PVD), comprising:
   providing a first stream of a first material from a first PVD source towards the waveguide combiner, the waveguide combiner includes an input coupling grating and an output coupling grating, the input coupling grating has at least a first fin structure and a second fin structure, the first stream provided in a first direction to one or more surfaces of a first fin structure and at a first non-perpendicular angle relative to the waveguide combiner;
   depositing the first material on the one or more surfaces of the first fin structure, the deposition of the first material forming a first protrusion extending laterally from the first fin structure;
   providing a second stream of a second material from a second PVD source towards one or more surfaces of the second fin structure of the input coupling grating, the second stream provided in a second direction and at a second non-perpendicular angle relative to the waveguide combiner; and
   depositing the second material on the one or more surfaces of the second fin structure, the deposition of the second material forming a second protrusion extending laterally from the second fin structure, the second protrusion converging with the first protrusion to form an encapsulation layer over the first and second fin structures of the input coupling grating.

2. The method of claim 1, wherein the encapsulation layer partially defines an air gap between the first fin structure and the second structure.

3. The method of claim 2, wherein the air gap comprises atmospheric air.

4. The method of claim 3, wherein the air gap is filled at or about atmospheric pressure.

5. The method of claim 3, wherein the air gap is filled at sub-atmospheric pressure.

6. The method of claim 1, wherein the first stream of the first material and the second stream of the second material are provided and deposited simultaneously.

7. The method of claim 1, wherein the first stream of the first material and the second stream of the second material are provided and deposited sequentially.

8. The method of claim 1, wherein the first material and the second material are substantially the same in composition.

9. The method of claim 1, wherein the first material and the second material are substantially different in composition.

10. The method of claim 1, wherein the first non-perpendicular angle is between about 70 degrees and about 89 degrees relative to a surface normal of the substrate.

11. The method of claim 1, wherein the second non-perpendicular angle is between about 91 degrees and about 110 degrees relative to a surface normal of the substrate.

12. The method of claim 1, further comprising:
   scanning the substrate through the first stream of the first material or the second stream of the second material via a movable support.

13. The method of claim 1, further comprising:
   directing the first stream of the first material through a collimator having at least one opening to limit an angular range of the first material passing through the at least one opening.

14. The method of claim 13, further comprising:
   directing the second stream of the second material through the collimator having the at least one opening to limit an angular range of the second material passing through the at least one opening.

15. The method of claim 1, wherein there is no deposition of the first material or the second material on a bottom portion of the first and second fin structures.

16. A method for encapsulating gratings of a waveguide combiner by asymmetric selective physical vapor deposition (PVD), comprising:
   providing a first stream of a first material from a first PVD source towards the waveguide combiner, the waveguide combiner includes an input coupling grating and an output coupling grating, the input coupling grating has at least a first fin structure and a second fin structure having a slant angle relative to a surface normal of the waveguide combiner, the first stream provided in a first direction to one or more surfaces of a first fin structure and at a first non-perpendicular angle relative to a plane of the waveguide combiner;
   depositing the first material on the one or more surfaces of the first fin structure;
   providing a second stream of a second material from a second PVD source towards the one or more surfaces of the second fin structure of the input coupling grating, the second stream provided in a second direction and at a second non-perpendicular angle relative to the plane of the waveguide combiner; and
   depositing the second material on the one or more surfaces of the second fin structure, wherein the deposition of the first material and the second material on the one or more surfaces of the second fin structure forms an encapsulation layer over the first and second fin structures input coupling grating.

17. The method of claim 16, wherein the first stream of the first material and the second stream of the second material are provided and deposited simultaneously.

18. The method of claim 16, wherein the first stream of the first material and the second stream of the second material are provided and deposited sequentially.

19. The method of claim 16, wherein the first material and the second material are substantially the same in composition.

20. A method for encapsulating gratings of a waveguide combiner by asymmetric selective physical vapor deposition (PVD), comprising:
   providing a first stream of a first material from a first PVD source towards the waveguide combiner, the waveguide combiner includes an input coupling grating and an output coupling grating, the input coupling grating has at least a first fin structure and a second fin structure, the first stream provided in a first direction to one or more surfaces of a first fin structure and at a first non-perpendicular angle relative to the waveguide combiner a;

directing the first stream of the first material through a collimator having at least one opening to limit an angular range of the first material passing through the at least one opening;

depositing the first material on the one or more surfaces of the first fin structure, the deposition of the first material forming a first protrusion extending laterally from a top portion of the first fin structure;

providing a second stream of a second material from a second PVD source towards one or more surfaces of the second fin structure of the input coupling prating, the second stream provided in a second direction and at a second non-perpendicular angle relative to the waveguide combiner;

directing the second stream of the second material through the collimator having the at least one opening to limit an angular range of the second material passing through the at least one opening; and depositing the second material on the one or more surfaces of the second fin structure, the deposition of the second material forming a second protrusion extending laterally from the second fin structure, the second protrusion converging with the first protrusion to form an encapsulation layer over the first and second fin structures of the input coupling grating, the encapsulation layer partially defining one or more air gaps between adjacent fins of the grating.

* * * * *